United States Patent [19]
McCarty et al.

[11] Patent Number: 5,307,239
[45] Date of Patent: Apr. 26, 1994

[54] ELECTROMECHANICAL MODULE WITH SMALL FOOTPRINT AND POST-SOLDER ATTACHABLE/REMOVABLE HEAT SINK FRAME

[75] Inventors: Paul McCarty, San Diego; Jerry I. Tustaniwskyj, Mission Viejo; Jon L. Zimmerman, Escondido, all of Calif.

[73] Assignee: Unisys Corporation, Blue Bell, Pa.

[21] Appl. No.: 958,372

[22] Filed: Oct. 8, 1992

[51] Int. Cl.⁵ .............................. H05K 7/20
[52] U.S. Cl. .................... 361/704; 174/16.3; 257/707; 257/719
[58] Field of Search ............ 361/383, 386, 387; 165/80.3, 185; 174/16.3; 257/706, 707, 713, 718, 719, 727; 24/295, 457, 458, 473, 625; 248/316.7, 505, 510; 267/150, 160; 411/352, 904, 907

[56] References Cited

U.S. PATENT DOCUMENTS

| | | | |
|---|---|---|---|
| 4,652,973 | 3/1987 | Baker | 361/395 |
| 4,679,118 | 7/1987 | Johnson | 361/386 |
| 4,745,456 | 5/1988 | Clemens | 357/79 |
| 4,978,638 | 12/1990 | Buller | 437/209 |
| 5,019,940 | 5/1991 | Clemens | 361/386 |
| 5,132,875 | 7/1992 | Plesinger | 361/383 |
| 5,208,731 | 5/1993 | Blomquist | 361/386 |

Primary Examiner—Gerald P. Tolin
Attorney, Agent, or Firm—Charles J. Fassbender; Mark T. Starr

[57] ABSTRACT

An electro-mechanical module comprises a packaged electrical part having a surface which dissipates heat, and a springy frame which overlies that surface. This frame includes a pair of fasteners for catching on the package at two predetermined locations, and the frame has an unstressed state in which the fasteners do not coincide with the two locations. However, the frame is springy enough to be stressed and thereby move the fasteners to the two locations, and thereafter return back towards the unstressed state and catch the fasteners on the package at the two locations. To complete the module, a heat sink rests on the surface and is removably attached to the frame.

12 Claims, 4 Drawing Sheets

FIG.3
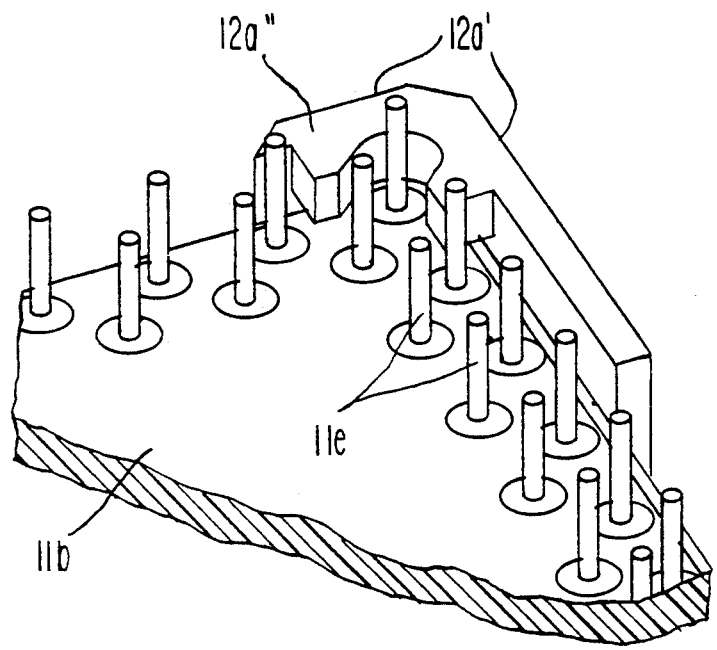
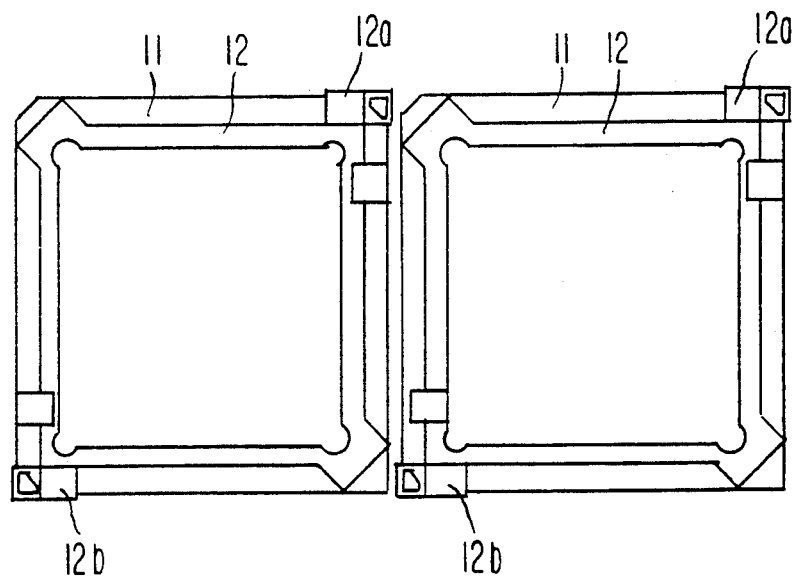
FIG.4

ELECTROMECHANICAL MODULE WITH SMALL FOOTPRINT AND POST-SOLDER ATTACHABLE/REMOVABLE HEAT SINK FRAME

BACKGROUND OF THE INVENTION

This invention relates to electromechanical modules which include an integrated circuit (IC) package and a heat sink that is attached to the IC package in a removable fashion.

By an IC package is herein meant any type of enclosure of one or more IC chips which provides input/output (I/O) terminals for the enclosed chips. Some examples of IC packages which are commonly used in the electronics industry are dual in-line IC packages and pin grid array packages, both of which have I/O terminals that get soldered into via holes in a printed circuit board; and, plastic leaded chip carriers and leaded flat-packs, both of which have I/O terminals that get soldered onto the surface of a printed circuit board.

Often, in order to remove heat from the IC package, a heat sink is attached to the IC package in a permanent fashion such as with an epoxy or a solder. However, a problem with such a permanent attachment is that if the IC package and the heat sink are made of different materials, they will have different thermal expansion rates; and as a result, the attachment material and the IC package can be stressed and crack when they are subjected to temperature cycles.

To avoid the above thermal cracking problem, electromechanical modules have been developed in which a heat sink is attached to an IC package in a removable fashion which allows the heat sink and the IC package to slide against each other during temperature cycling. These modules are disclosed in U.S. Pat. No. 4,745,456 issued May 17, 1988 to Donald L. Clemens in his FIGS. 1 thru 14. However, although the Clemens' patent does teach how to solve the above described thermal cracking problem, all of the disclosed modules have several other drawbacks.

In particular, one of the drawbacks is that the footprint of the completed module is substantially larger than the footprint of the IC package by itself. By the term "footprint" is herein meant the area which the item in question occupies on a printed circuit board when that item is soldered to the printed circuit board. In the Clemens patent, the footprint of the completed module is substantially larger than the footprint of the IC package by itself because every embodiment includes a frame which is required to completely surround the IC package. This frame is shown in FIGS. 1, 9, and 14 respectively by reference numerals 32, 132, and 232. Consequently, when several of the Clemens' modules are soldered next to each other on a printed circuit board the frames of adjacent modules hit each other, and that reduces their density.

Another drawback of the Clemens, module is that the frame and the IC package must be assembled together before the IC package is soldered into a printed circuit board. This limitation occurs because in the Clemens' module, the I/O leads of the IC package must pass through the frame before the IC package is soldered to the printed circuit board, and, the frame gets trapped between the printed circuit board and the IC package. Likewise, after the Clemens' module is soldered to a printed circuit board, the frame cannot be removed without desoldering the IC package from the board.

Due to the above limitations, the removal of a defective module from a printed circuit board is made more difficult in comparison to the removal of just an integrated circuit package by itself. Likewise, the attachment to a printed board of an operable module is made more difficult than the attachment of just an operable integrated circuit package by itself. Why this is so is described in further detail in the detail description.

Accordingly, the primary object of the invention is to provide an electromechanical module with a small footprint and post-solder attachable/removable heat sink frame by which all of the above described problems are overcome.

BRIEF SUMMARY OF THE INVENTION

One preferred embodiment of the present invention is an electromechanical module which includes a pin grid array IC package having a bottom surface with I/O terminals and a top surface without I/O terminals; and, a rectangular ring-shaped frame that lies on the top surface of the IC package. This frame includes a pair of fasteners for catching on the edges of the IC package at two opposite corners, and it has an unstressed state in which the fasteners are spaced apart by a distance which is less than the distance between those two corners. Further, the frame is springy, and it can be squeezed inward from two sides to thereby move the fasteners outward past the two opposite corners of the IC package. Then, when the squeezing force is removed, the frame starts to return back to its unstressed state which causes the fasteners to catch on the corners of the IC package. To complete the module, it includes a heat sink which fits into the ring-shaped frame and rests on the top surface of the IC package; and, it includes a holding member which removably holds the heat sink to the frame.

With this embodiment, a small footprint is achieved because the frame, the heat sink, and the holding member all lie almost entirely on the top surface of the IC package; only, the two fasteners of the frame extend slightly beyond the IC package. Also with this embodiment, the frame is attachable/removable from the IC package while the IC package is soldered to a printed circuit board, because the two fasteners get caught on the IC package corners and removed therefrom simply by squeezing and releasing the frame.

BRIEF DESCRIPTION OF THE DRAWINGS

Various preferred embodiments of the invention, as well as their features and advantages, are described herein in conjunction with the accompanying drawings wherein:

FIG. 3 is a greatly enlarged cut away view of a portion of the FIG. 1 embodiment which shows additional details of how the frame attaches to the IC package;

FIG. 4 shows how several of the FIG. 1 modules can be positioned on a printed circuit board with the high density;

DETAILED DESCRIPTION

Figure 1:
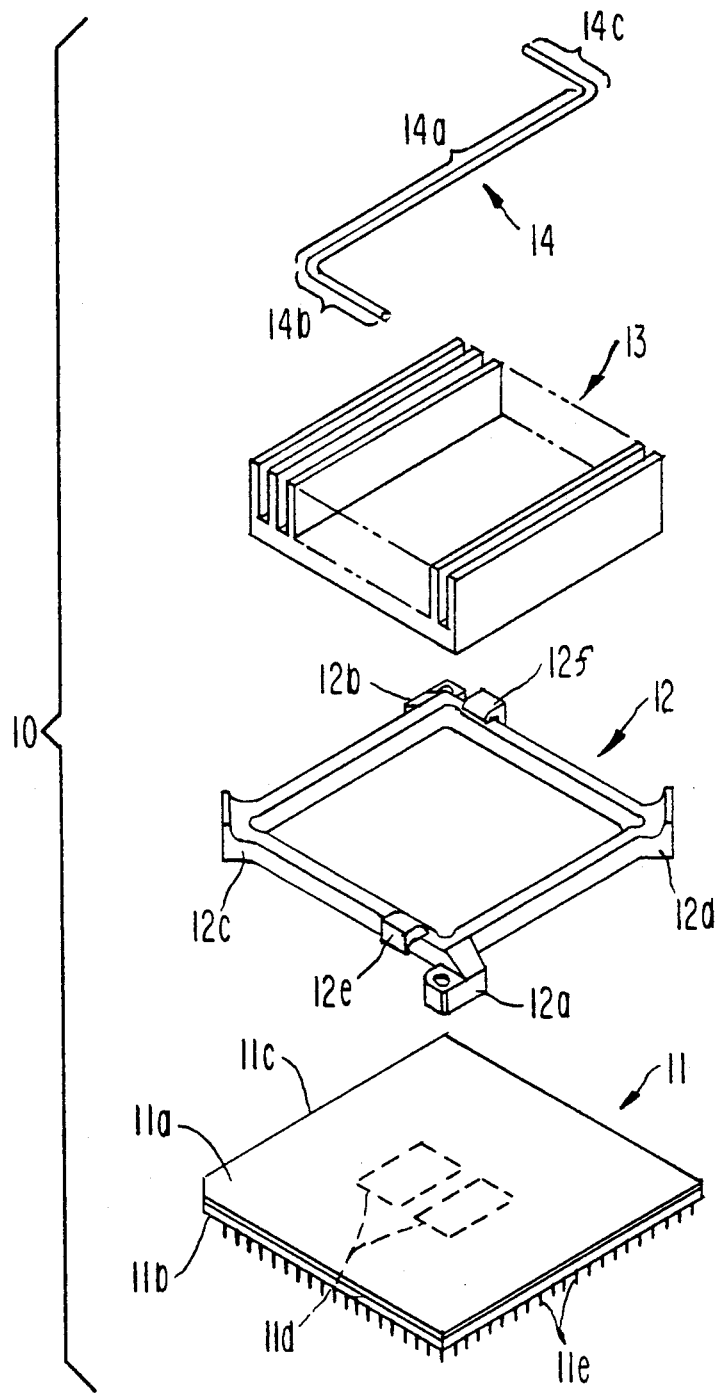
FIG. 1 is an exploded view, drawn approximately to scale, of one preferred embodiment of the invention.

Referring now to FIG. 1, one preferred embodiment of a module 10 which is structured in accordance with the present invention will be described in detail. This module 10 is shown in actual size in an exploded view so that all of the component parts 11, 12, 13, and 14 can be seen clearly.

Part 11 is a thin flat pin grid array IC package. This package 11 has a top surface 11a, a bottom surface 11b, and a rectangular perimeter which is defined by edges 11c. Enclosed within the IC package are one or more IC chips 11d; and, electrical signals are sent to and received from the chips 11d via a plurality of I/O terminals 11e which extend from the bottom surface 11b to the chips.

Part 12 is a rectangular ring shaped frame which lies on top surface 11a of the IC package. This frame 12 includes a pair of fasteners 12a and 12b on two opposite corners of the frame, and the function of the fasteners is to catch onto the edges 11c at two corners of the IC package. Details on how this catching occurs is shown herein in FIGS. 2 and 3; and, those figures will be described after the remainder of FIG. 1 has been described. Frame 12 also includes a pair of tabs 12c and 12d on the two remaining corners of the frame.

Part 13 is a heat sink whose function is to cool the IC package. This heat sink 13 is shaped to fit within the ring shape frame 12 and lie on the top surface 11a of the IC package.

Part 14 is a holding member which removably holds the heat sink in place. This member 14 has a central portion 14a and two ends 14b and 14c. Portion 14a lies across the heat sink 13, and the two ends 14b and 14c respectively fit under two protrusions 12e and 12f on the frame 12.

Figure 2:
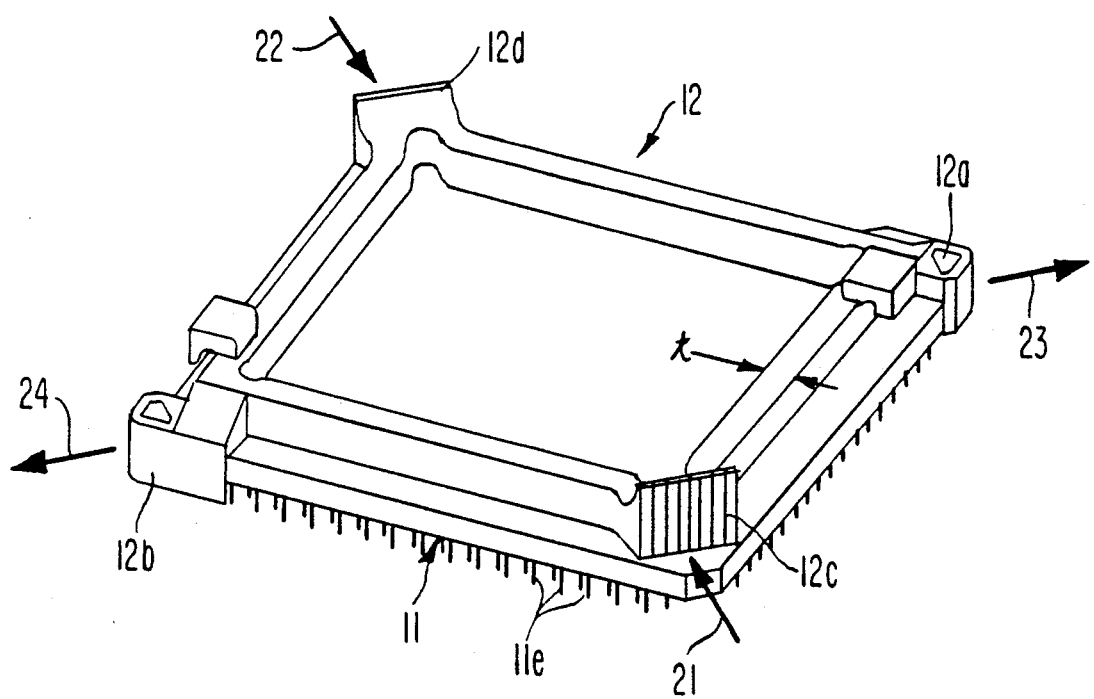
FIG. 2 is an enlarged view of the FIG. 1 embodiment which illustrates how the frame is attached to the IC package.

Now in order to assemble all of the parts 11–14 together, one proceeds as follows. Initially, the frame 12 is attached to the IC package 11. This is achieved, as shown in FIG. 2, by manually squeezing the tabs 12c and 12d towards each other as indicated by the arrows 21 and 22. Due to this squeezing, the fasteners 12a and 12b move further apart as indicated by the arrows 23 and 24, and that moves the fasteners past the corners of the IC package 11. Then, while keeping the fasteners aligned with the IC package corners, the squeezing forces on the tabs 12c and 12d are removed; and as a result, fasteners 12a and 12b move back toward their original position and catch on the corners of the IC package 11.

In other words, the frame 12 is springy; and, it has a quiescent or unstressed state in which the fasteners 12a and 12b are spaced apart by distance that is too small for the fasteners to catch on the opposite corners of the IC package However, when the tabs 12c and 12d are squeezed towards each other, the frame's sides bend like respective beam springs; and, that bending motion moves the fasteners 12a and 12b past the opposite corners of the IC package. Then, when the squeezing forces are removed, the frame starts to return back to its unstressed state whereupon the fasteners 12a and 12b get caught on the IC package.

FIG. 3 shows how one of the fasteners 12a looks, when viewed from the bottom surface 11b of the IC package, after the fastener has been attached to the package by the above described procedure. There, a portion 12a' of the fastener pushes against the edge of the package, and a portion 12a" of the fastener extends slightly onto the bottom surface 11b. Fastener 12b has similar portions which are herein referred to as portions 12b' and 12b", but they are not shown.

After the frame 12 is attached to the IC package 11 as described above, the remaining assembly steps consist of: a) placing the heat sink 13 on the top surface 11a of the IC package within the frame 12, and b) locking the heat sink in place by placing the central portion 14a of the holding member across the heat sink and bending the end portions 14b and 14c under the protrusions 12e and 12f of the fastener.

When the assembled module 10 is subjected to temperature cycling, none of the components 12, 13, and 14 induce any mechanical stress into the IC package 11. This is because the heat sink 13 is free to slip on the top surface 11a of the IC package 11 whenever those two members thermally expand or contract at different rates. By comparison, if the heat sink 13 was rigidly attached to the top surface 11a of the IC package, by solder for example, than any mismatch in the thermal expansion rate of those two members would stress the package and the joint with the heat sink.

One feature of the module 10 over the prior art is that the components 12, 13, and 14 can be attached to the IC package 11 as described above either before or after the IC package has its I/O terminals soldered into a printed circuit board. Preferably, the components 12, 13 and 14 are attached after the IC package is soldered. This avoids subjecting the components 12, 13, and 14 to high temperatures which may cause them permanent damage; and in addition, it reduces IC package handling before soldering which in turn reduces the chances of inadvertently bending the I/O terminals.

Likewise another feature of the module 10 is that all of the components 12, 13, and 14 are removable from the IC package 11 after the I/O terminals of the package have been soldered to a printed circuit board. This feature makes it easier to replace an IC package when it becomes defective. In such a replacement procedure, the holding member 14 is removed by bending the ends 14b and 14c off of the frame protrusions 12e and 12f; then the heat sink 13 is removed from the frame 12; and then the frame 12 is detached from the IC package 11 by squeezing the tabs 12c and 12d towards each other and thereby moving the fasteners 12a and 12b off of the corners of the IC package. Thereafter, the I/O terminals 11e of the IC package can be desoldered from the printed circuit board by exposing the terminals to a high temperature which melts the solder; and, such a high temperature will not damage the components 12, 13, and 14 since they have been removed.

When a defective IC package is removed as described above and replaced with a new operable IC package, the heating of the solder on the I/O terminals of the defective/new package can be performed by directing a stream of hot air on those terminals. And, another feature of the module 10 during such a removal/attachment operation is that the components 12–14 are off of the packages; and thus, those components, and particularly the frame, do not obstruct the flow of air past the I/O terminals. If the flow of hot air past the I/O terminals is impeded, such as by a frame which surrounds the package and blocks the I/O terminals, then the temperature of the hot air and/or the time duration of the hot air flow would need to be increased. But that, however, can cause some of the I/O terminals of neighboring I/C packages to get desoldered.

Another feature of the above described module 10 is that its footprint is determined almost entirely by the size of the IC package 11. This feature occurs because, except for portion 12a' and 12b' of the fasteners, none of the component parts in the completed module 10 extend past the edge 11c of the IC package. Thus when several of the modules are soldered by their I/O terminals onto a single printed circuit board, the IC packages 11 can be spaced essentially side by side.

This small footprint feature is illustrated in FIG. 4. Preferably the fastener portions 12a' and 12b' are each less than 50 mils thick, and preferably the fastener portions 12a'' and 12b'' extend onto the bottom surface of the IC package by less than 50 mils. That allows the IC packages to be spaced by 100 mils if the components 11, 12, and 13 are to be installed and/or removed while the IC packages are soldered into a printed circuit board, and it allows a spacing of 50 mils if the components 11, 12, and 13 are to be installed and removed with the IC package. Also, since the fasteners of adjacent packages do not interfere with each other, the above spacing distances are not doubled.

One preferred embodiment of the invention has now been described in detail. In addition however, many changes and modifications can be made to these details without departing from the nature and spirit of the invention.

For example, all the components 11–14 can be made of various materials. Suitably, the IC package 11 is made of ceramic; the frame 12 is made of plastic; the heat sink 13 is made of a metal such as aluminum; and the holding member 14 is made of a metal such as spring steel.

Also, the IC package 11 can be replaced with any packaged electrical part that has a surface which dissipates heat and needs a heat sink. For example, the IC package 11 can be replaced with a packaged high-power transistor or a packaged transformer. Likewise, the heat sink 13 can have various shapes so long as it fits in the frame. Also, the fastening member 14 can have various shapes so long as it holds the heat sink to the frame.

Also, as another modification, the tabs 12c and 12d on the frame can be deleted. That is, the squeezing forces can be applied to the outside of the frame without providing special tabs which make the application of the forces more convenient. Alternatively, expanding forces can be applied directly to the inside of frame near the fasteners.

As still another modification, the frame 11 can have any desired cross-section so long as the cross-section is adjusted in size in order to achieve the degree of frame flexibility that is needed without overstressing the frame. For example, the frame 11 can have a circular cross-section or a rectangular cross section, and these cross-sections can be either uniform or non-uniform. In each case, the flexibility of the frame will increase as the thickness "t" of the cross-section decreases.

Figure 5:
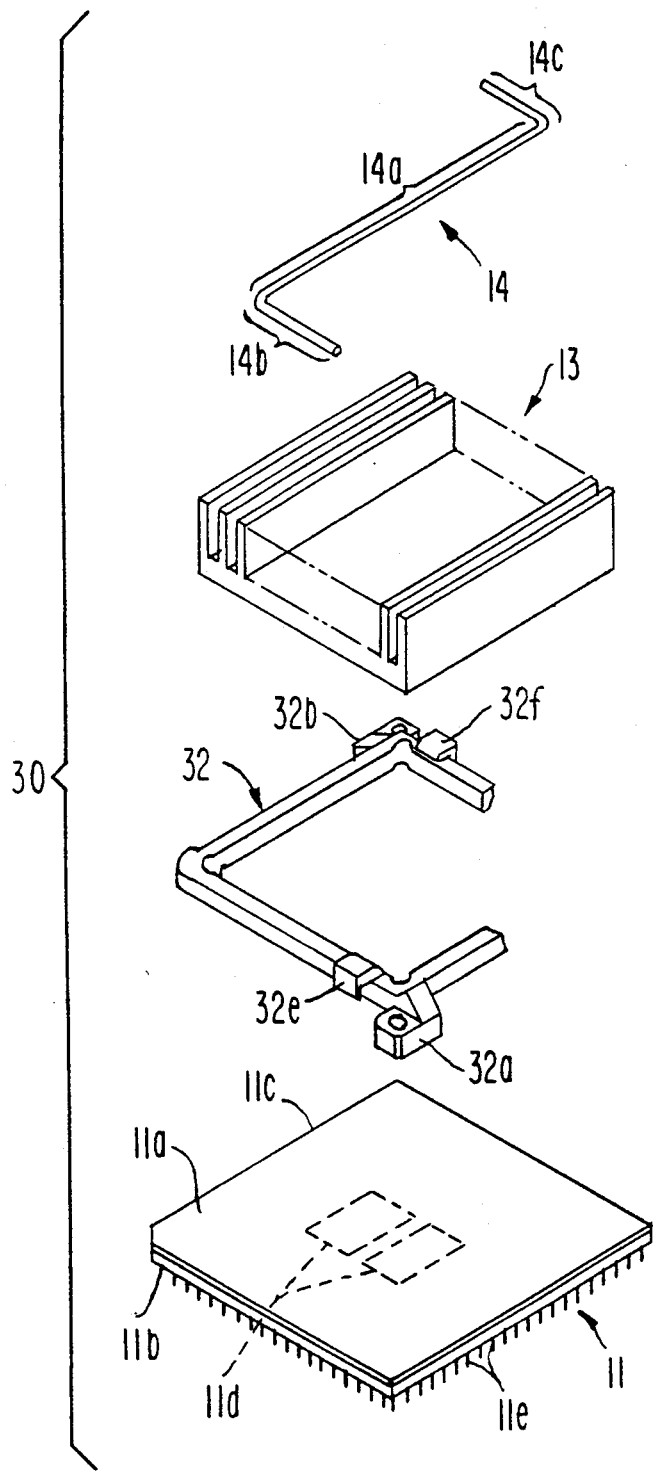
FIG. 5 is an exploded view of other embodiments of the invention; and, FIG. 5A shows a circular frame 32' which can replace frame 32 in FIG. 5".

Further, as another modification, the frame itself can be a ring with various non-rectangular shapes. For example, the frame can have an oval shape as shown in FIG. 5 or hexagonal shape. Also, the frame need not even be a ring; it can have any shape which is springy, fits on the top surface 11a, includes the fasteners 12a and 12b, and provides room for the heat sink. An example of such a springy frame 32 which is substantially C-shaped is shown in FIG. 5.

Figure 5A:
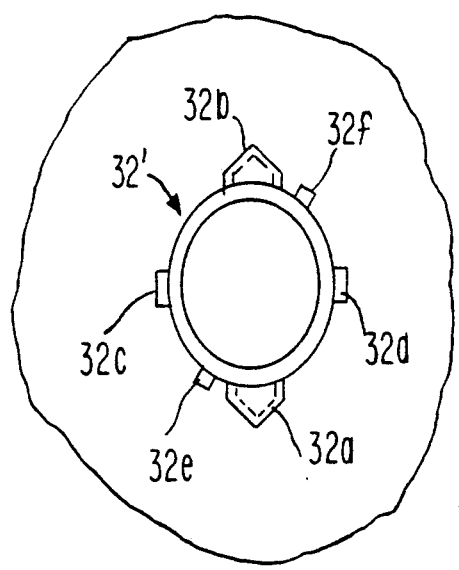
FIG. 5A is an exploded view of still another embodiment of the invention.

Frame 32 as well as frame 32' in FIG. 5A is a modification of the previously described frame 12 as shown. Each of the, items 32a, 32b, 32c, 32d, 32e and 32f on the frame 32 and/or frame 32' correspond to items 12a, 12b, 12c, 12d, 12e, and 12f respectively on the frame 12. All of the other components which make up a complete module 30 remain unchanged, and they are indicated in FIG. 3 by their FIG. 1 reference numerals 11, 13, and 14.

To attach the frame 32 to the IC package 11, the fasteners 32a and 32b are manually spread apart until they extend past two opposite corners of the package. Then, the fasteners are allowed to spring back and catch on the IC package corners. Thereafter, the remaining parts, 13 and 14 are assembled the same as in FIG. 1.

As another modification, the fasteners need not be located on two opposite corners of the frame. In general, the fasteners need only be positioned at any two locations on the frame which in an unstressed state do not coincide with the catch locations on the packaged electrical part, but which by squeezing or otherwise stressing the frame, can be made to coincide with the catch locations on the packaged electrical part.

As yet other modification, the heat sink 13 as well as the frame 32 and holding member 14 can be enlarged beyond the perimeter of the IC package 12 in order to provide more cooling for the IC package. This modification will of course increase the footprint of the complete module; however, this modification will retain the advantage of being able to attach and/or remove all of the parts 13, 14 and 32 from the IC package while it is soldered to the printed circuit board.

Accordingly, in view of all of the above modifications, it is to be understood that the invention is not limited to just the illustrated preferred embodiments but is defined by the appended claims.

What is claimed is:

1. An assembled electro-mechanical module comprising:
   a thin flat packaged electrical part having smooth edges and a top surface which dissipates heat;
   a springy frame which overlies and contacts said top surface;
   said frame including a pair of fasteners and having an unstressed state, when said module is disassembled, in which said fasteners are separated by a distance which prohibits said fasteners from being caught on said smooth edges at two predetermined locations;
   said frame being springy and distorted by stress in said assembled module such that said distance is increased and said fasteners are caught on said smooth edges as said two locations;
   a heat sink which rests on said top surface and is removably attached to said frame; and
   said heat sink and said frame, except for a portion of said fasteners fitting entirely within the perimeter of said edges.

2. A module according to claim 1 wherein said frame is ring shaped.

3. A module according to claim 1 wherein said frame is shaped as part of a ring.

4. A module according to claim 1 wherein said frame has sides with a predetermined cross-section that gives the frame a certain flexibility.

5. A module according to claim 1 wherein said frame is made of plastic.

6. A module according to claim 1 wherein said frame includes a pair of tabs which, when squeezed, move said fasteners outward.

7. A module according to claim 2 wherein said ring-shaped frame is rectangular.

8. A module according to claim 2 wherein said ring-shaped frame is circular.

9. A module according to claim 4 wherein said cross-section is a uniform rectangular cross-section.

10. A module according to claim 4 wherein said cross-section is a uniform circular cross-section.

11. A module according to claim 4 wherein said cross-section is a non-uniform rectangular cross-section.

12. A module according to claim 4 wherein said cross-section is a non-uniform circular cross-section.

* * * * *